United States Patent
Carlson

(12) 
(10) Patent No.: US 6,292,052 B1
(45) Date of Patent: Sep. 18, 2001

(54) OUTPUT AMPLIFIER FOR A DISCRETE FILTER-LESS OPTICAL REFERENCE RECEIVER

(75) Inventor: John E. Carlson, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/602,574

(22) Filed: Jun. 22, 2000

Related U.S. Application Data

(60) Provisional application No. 60/187,195, filed on Mar. 6, 2000.

(51) Int. Cl.[7] ............................. H03F 1/02; G11C 27/02
(52) U.S. Cl. ...................... 330/9; 330/51; 330/69; 330/109; 330/124 R; 327/91; 327/124
(58) Field of Search ........................... 330/9, 51, 69, 330/109, 124 R; 327/91, 124

(56) References Cited

U.S. PATENT DOCUMENTS

| | | | |
|---|---|---|---|
| 5,363,055 | * 11/1994 | Ribner | 330/9 |
| 5,585,756 | * 12/1996 | Wang | 327/341 |
| 5,751,189 | * 5/1998 | Shyu et al. | 330/9 |
| 5,923,206 | * 7/1999 | Levinson | 330/109 |
| 5,973,536 | * 10/1999 | Maejima | 330/9 |
| 6,225,873 | * 5/2001 | Goumaz | 327/91 |

FOREIGN PATENT DOCUMENTS

9223283 * 8/1997 (JP).

OTHER PUBLICATIONS

Author Unknown, IBM Technical Disclosure Bulletin, "Capacitance Bridge for MOS Devices" Dec. 1, 1974 vol. #17, Issue #7 pp 2013–2014.*

Hewlett–Packard Journal, Dec. 1996: "Design of Optical Receiver Modules for Digital Communications Analysis"— by Christopher M. Miller, et al., pp. 22–31. XP000685939.

* cited by examiner

*Primary Examiner*—Michael B Shingleton
(74) *Attorney, Agent, or Firm*—William K. Bucher

(57) ABSTRACT

An output amplifier for a strobed sampling circuit has first and second operational amplifiers coupled to receive the sampled output from the sampling circuit. The operational amplifiers each have a RC circuit having a high ohmic value resistor that is coupled from its inverting input terminal to its output terminal. The non-inverting input terminals receive biasing voltages that are coupled to the sampling circuit. The gating strobes to the sampling circuit produces a DC current through the feedback resistor as a result of strobe pulses being integrated by the RC circuit. Respective electronic switches are coupled in parallel with the RC circuits of the operational amplifiers and are closed at a predetermined time interval after each strobe pulse to discharge the stored charge on the capacitors prior to the next strobe pulse. The output signals from the operational amplifiers are summed in a summing amplifier.

15 Claims, 6 Drawing Sheets

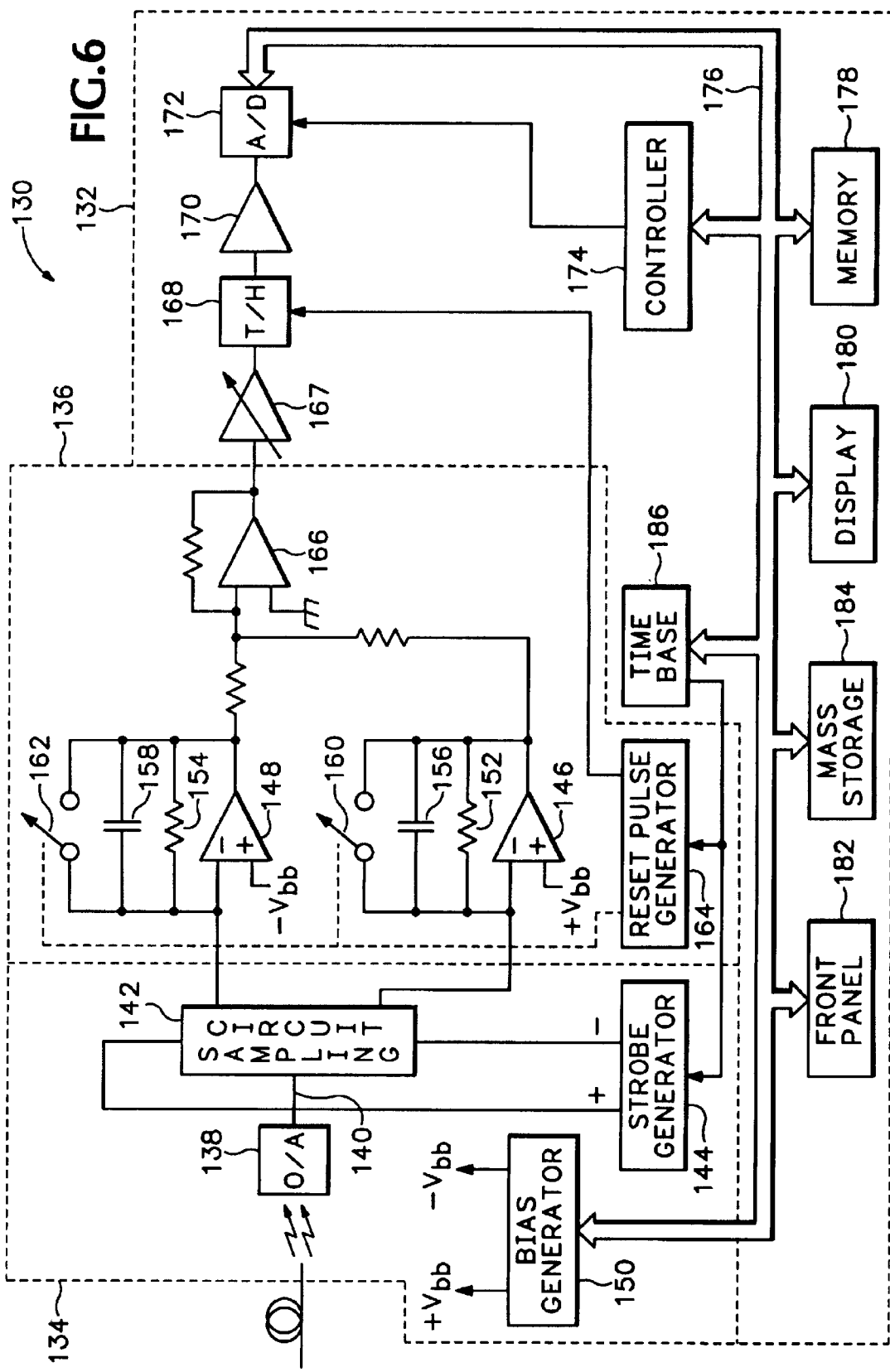

OUTPUT AMPLIFIER FOR A DISCRETE FILTER-LESS OPTICAL REFERENCE RECEIVER

CROSS-REFERENCE TO RELATED APPLICATION

This application claims the benefit of the U.S. Provisional Application No. 60/187,195, filed Mar. 6, 2000.

BACKGROUND OF THE INVENTION

The present invention relates generally to reference receivers and more specifically to discrete filter-less optical reference receiver and output amplifier having a system frequency response curve predominantly established by a sampling circuit.

A reference receiver is a measurement instrument that is bounded in the frequency domain by defined tolerance limits. Ideally, the frequency response curve should be Gaussian but such a response can be difficult to achieve, especially at high data rates, such as 10 Gb/s and beyond. In the telecommunications industry, the typical reference receiver has a has a system frequency response curve that matches a Bessel-Thompson filter response. The predominant frequency response of previous reference receivers has traditionally been established by discrete reference receiver filters at the input of the receiver having frequency responses that match a $4^{th}$ or $5^{th}$ order Bessel-Thompson frequency response.

The telecommunications industry is continually establishing standards for the ever increasing data rates used in the industry. Most telecommunications and data communications industry standards define acceptable scalar frequency response characteristics that test equipment must have when performing eye-pattern conformance testing of fiber based optical signals. The industry standards define the scalar frequency response as having a Bessel-Thompson shape (near Gaussian) with the −3 dB electrical power response rolloff point at ¾ of the bit rate. For example, a reference receiver for a 2.488 Gbps SONET signal would have a nominal −3 dB point at 1.87 GHz. FIG. 1 shows a graphical representation of the Bessel-Thompson shape scalar frequency response for a generic reference receiver. The frequency response has upper and lower tolerance limits that the reference receiver must meet for telecommunications and data systems.

As new standards are being proposed, the telecommunications standards committees approach test equipment manufacturers to solicit proposals for establishing the upper and lower tolerance limits for the proposed standards. Tolerance limits proposed by test equipment manufactures are based on the reference receiver design and the components used in the design. The data profile in FIG. 1 shows aberrations in the data that may be caused by a number of factors. A significant cause of data aberrations is commonly the discrete reference receiver filter.

Referring to FIG. 2, there is shown a typical reference receiver 10 designed for measuring optical signals by the telecommunications industry. The reference receiver has an optical-to-electrical (O/E) converter 12 that receives the optical signal under test. Typically the O/E converter is a photodiode 14 that converts the optical signal to a corresponding electrical signal. A transmission line couples the electrical signal to a first switch 16 that is connected via a second switch 18 to a series of discrete reference receiver filters 20, 22. Transmission lines are also used to connect the switches and filters together. The O/E converter 12 includes a termination resistor or resistors 24 that reverse terminates the converter 12 in the characteristic impedance of the transmission line. The reference receiver filters 20, 22 are selectively switched into the reference receiver depending on the data rate of the optical input signal. For example, the discrete reference receiver filters may have a Bessel-Thompson shape scaler frequency response for 622 Mbps and 9.953 Gbps data rates. The filtered electrical signal output of the respective discrete reference receiver filters 20, 22 are selectively coupled via a third switch 26 to a fourth switch 28 that also receives the unfiltered electrical signal from the O/E converter 12 via a separate transmission line. The fourth switch 28 selectively couples the filtered electrical signal and the unfiltered electrical signal to a sampling circuit 30. The sampling circuit 30 includes a termination resistor 32 that terminates the transmission line in its characteristic impedance. Generally, the transmission lines have a 50 ohm characteristic impedance requiring 50 ohm termination resistors. The sampling circuit 30 includes two series connected diodes 34, 36 having a common node 38 receiving the filtered and unfiltered electrical signals. Opposing negative and positive strobe pulses are applied to the opposing sides 40, 42 of the diodes for gating the diodes 34, 36 into conduction. Positive and negative bias voltages are applied to the respective diodes via resistors 44, 46 to bias the diodes 34, 36 for selected turn on and turn off times.

A number of drawbacks are associated with current reference receiver designs. One major drawback is the generation of reflections from the discrete electrical filters requiring reverse termination of the optical-to-electrical converter. The reverse termination resistor absorbs a substantial portion of these reflected signals, for example 95% of the reflected signal, and provides a good temporal response in the presence of discrete filters. If the discrete filter produces a 10% reflection, then there is a ½% reflection that is coupled into the sampling circuit. Such reflections cause aberrations in the sampled signal as represented by the aberrations in the data in FIG. 1. These types of aberrations are taken into account by test equipment manufactures in making recommendations for the tolerance limits for reference receiver standards. Another drawback to current reference receiver designs is that the reverse termination resistor generally tends to flatten the frequency response of the system and produce a much steeper roll-off than a non-reverse terminated system. The result is further deviation from the ideal Gaussian response and renders the system with more aberrations when using it for non-filter applications when all-out bandwidth is desired. A discrete electrical filter in the high frequency path also increases the possibility of group delay distortion caused by the filter itself.

FIG. 3 is a schematic representation of a prior art output amplifier circuit 50 associated with a prior art reference receiver 10. Operational amplifiers 52, 54 have their respective non-inverting input terminals connected to bias voltages $+V_{bb}$ and $-V_{bb}$. The inverting input terminals of the operational amplifiers 52, 54 are set to the respective bias voltage levels of the non-inverting input terminals by feedback through resistors 56, 58. The bias voltages on the inverting input terminals are coupled to the sampling circuit 30 as the biasing voltages for the sampling diodes 34 and 36. An offset voltage may be applied to the sampling diodes 34 and 36 that shifts the bias voltages levels in common mode. The feedback resistors 56, 58 in the operational amplifier circuits 52, 54 have a high ohmic value in the range of 100 Megohms to reduce the amplifiers noise for generating a cleaner output signal. The output signals from the operational amplifiers 52, 54 are summed together at the inverting input terminal of a summing amplifier 60. The output signal from the summing amplifier 60 is digitized and further processed to produce a display on a display device. A zero volt input to the sampling circuit 30 with no bias offset causes the relative bias level of each diode to be equal. The positive and negative strobe pulses drive the sampling diodes 34 and 36 into conduction with the resulting sampling charge from each diode being balanced. The resulting capacitor charge on each of the operational amplifiers 52, 54 generates respective integrated voltages at the output of the amplifiers that cancel each other out. Any non-zero voltage input unbalances the instantaneous total bias between one diode and the other resulting in a measurable difference in the integrated voltages of the operational amplifiers 52, 54.

Current reference receivers with this type of amplifier strobe the sampling circuit 30 in a range of 40 to 50 Ksamples/second. The respective strobe signals to the sampling circuit are rectified by the sampling diodes 34, 36 resulting in a series of charge impulses into the amplifiers 52, 54. The charge pulses are integrated to produce a DC current through each of the 100 Megohm feedback resistors 56, 58 in the operational amplifiers 52, 54 resulting in a DC voltage at the respective amplifiers 52, 54 outputs. A 40 Ksamples/sec strobe could, for instance, produce a 50 nano-amp DC current through the respective feedback resistors 56, 58, which produces an output voltage level of 5 volts. Increasing the strobe rate increases the integrated DC currents coupled through the operational amplifiers 52, 54. At a certain rate, the DC currents through the feedback resistors 56, 58 overdrives the operational amplifiers 52, 54 causing distortion of the output signals.

What is needed is a time domain reference receiver sampling system for optical signals that does not have the drawbacks of conventional reference receivers having discrete reference receiver filters. The reference receiver sampling system should have a optical-to-electrical converter with a high impedance source for generating an electrical signal having an optimum temporal response more closely resembling the actual optical signal and configured to effectively utilize the current output of the high impedance source. The reference receiver sampling system should also have a sampling circuit that is strobed at a substantially higher sampling rate than conventional reference receiver sampling systems. The sampling circuit should have an output amplifier circuit that can receive output signals at the conventional and higher strobe rate without generating a distorted output signal.

SUMMARY OF THE INVENTION

Accordingly, the present invention is to an output amplifier receiving a sampled input signal from a strobed wideband sampling circuit containing a portion of a sampling strobe pulse that produces a DC current in response to the integrated strobe pulse. The output amplifier has first and second operational amplifiers that receives the sampled input signal from the strobed sampling circuit. Each operational amplifier has an inverting input terminal and an output terminal and a RC circuit having a high ohmic value resistor in parallel with a charging capacitor. Each RC circuit is coupled from the inverting input terminal to the output terminal of their respective operational amplifier with the respective capacitors storing a charge in response to the strobe pulse. A first and a second switch are respectively coupled in parallel with RC circuit of each operational amplifier. A reset pulse generator produces a time delayed reset pulse that is applied to the first and second switches at a delayed time interval from the sampling strobe pulse for removing the stored charge on the capacitor.

In the preferred embodiment of the output amplifier, the high ohmic values resistors are 100 megohm resistors and the first and second switches are electronic switches. The delayed time interval of the reset pulse is in the range of 500 nanoseconds and the sampling strobe pulse has a strobe pulse rate in the range of 200 Ksamples per second. Additionally, a bias generator produces negative and positive bias voltages that are respectively applied to the first and second operational amplifiers The output amplifier of the present invention is usable in a sampling oscilloscope having a sampling circuit receiving an input signal and producing a sampled output signal in response to a sampling strobe pulse. The sampled output signal contains a portion of the sampling strobe pulse that produces a DC current in response to the integrated strobe pulses. The output sampled signal from the sampling circuit is coupled to an output amplifier. The sampling oscilloscope has a bias generator that produces negative and positive bias voltages that are respectively applied to the first and second operational amplifiers. A strobe generator receives a timing strobe pulse for generating the sampling strobe pulse to the sampling circuit. The rest pulse generator also receives the timing strobe pulse for generating the time delayed reset pulse. The timing strobe pulse is generated by a time base generator or other similar type timing circuitry. In the preferred embodiment of the invention, the sampling strobe pulse has a strobe pulse rate in the range of 200 Ksamples per second and the delayed time interval of the rest pulse is in the range of 500 nanoseconds.

The objects, advantages and novel features of the present invention are apparent from the following detailed description when read in conjunction with the appended claims and attached drawings.

BRIEF DESCRIPTION OF THE DRAWING FIGURES

FIG. 6 is a representative block diagram of a reference receiver sampling system incorporating a sampling oscilloscope with the reference receiver and associated output amplifier according to the present invention.

DETAILED DESCRIPTION OF THE PREFERRED EMBODIMENT

Figure 1:
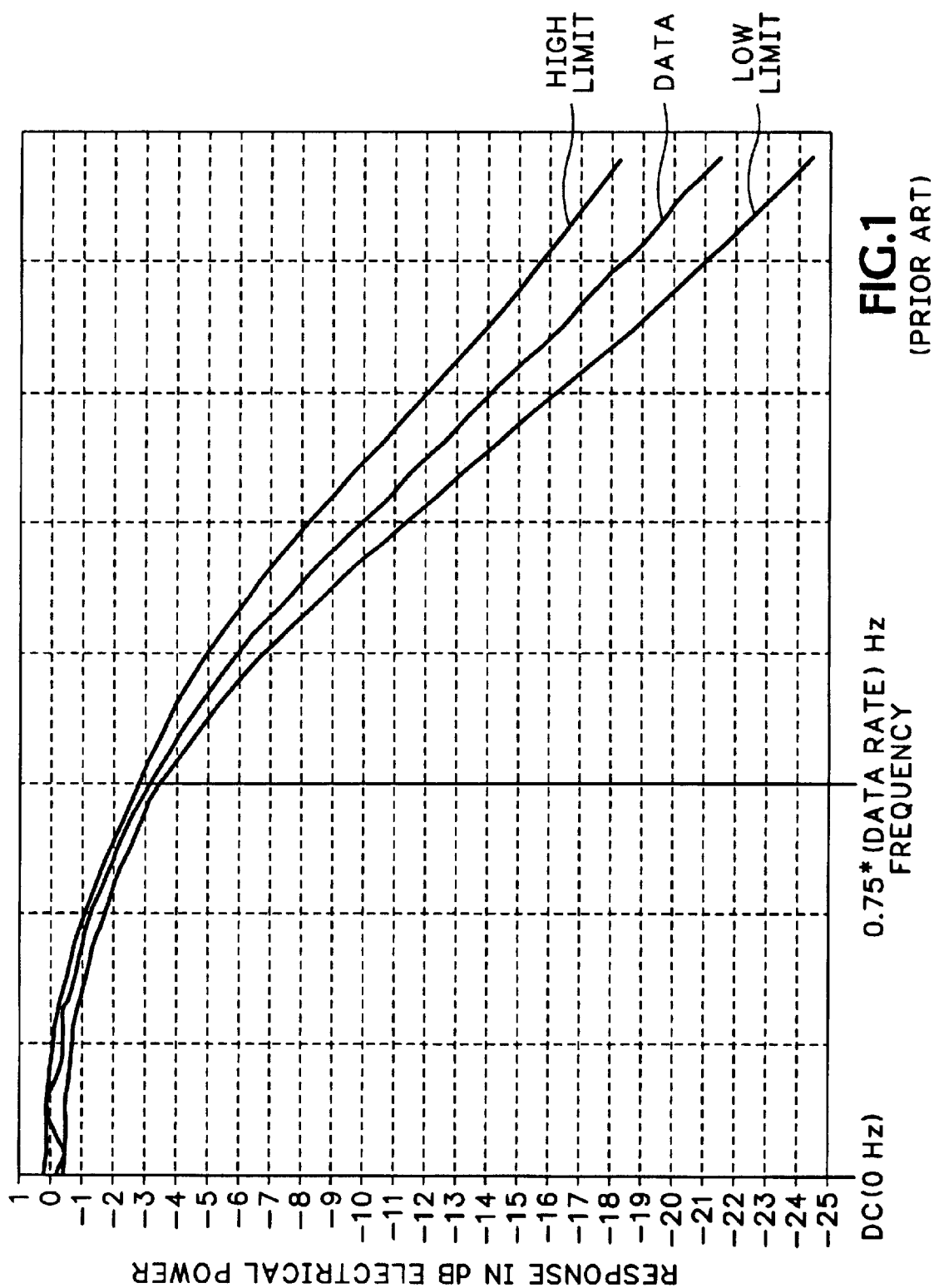
FIG. 1 is a graphical representation of a Bessel-Thompson shape scaler frequency response for a reference receiver.
Figure 2:
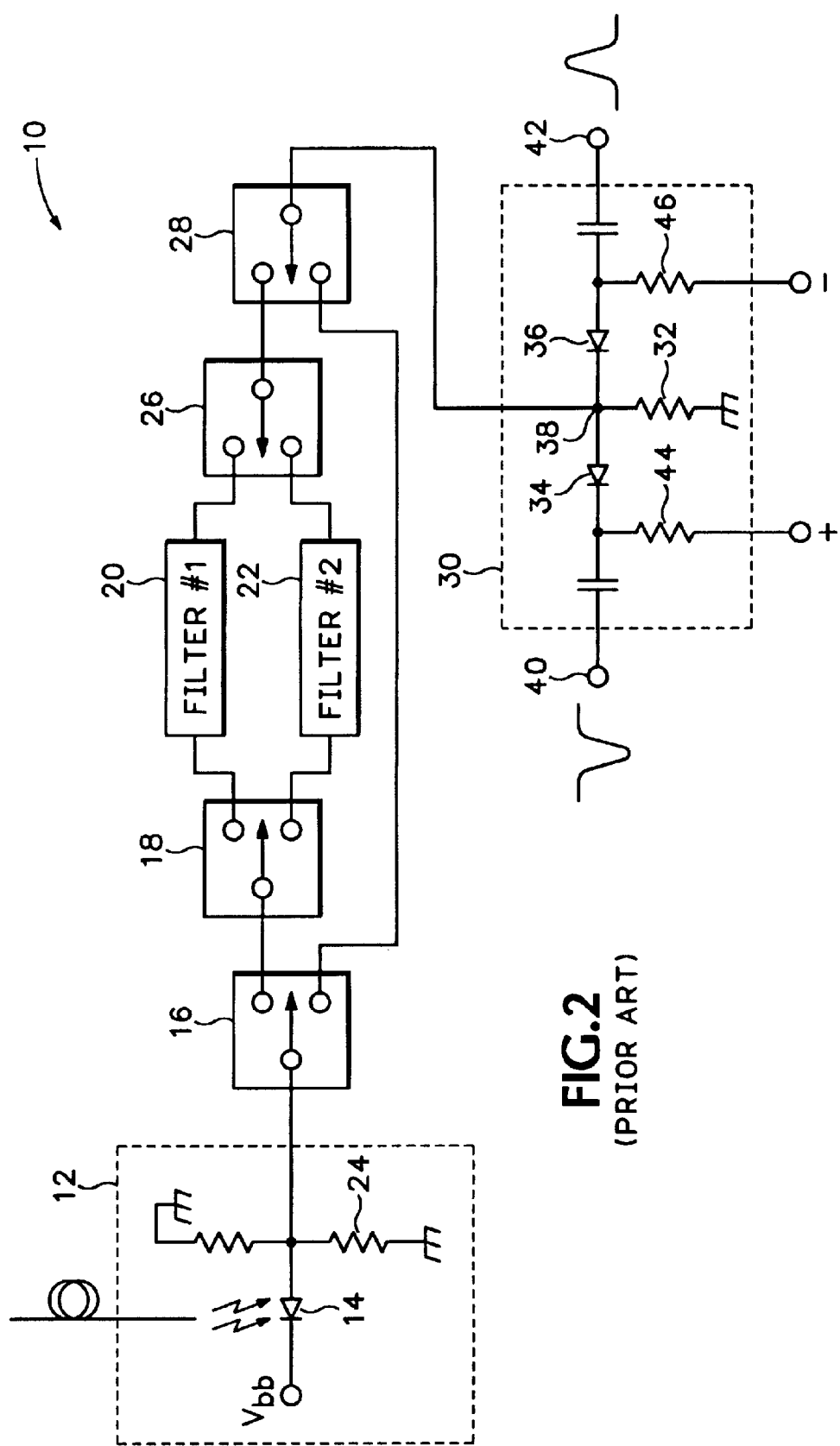
FIG. 2 is a typical prior art reference receiver designed for measuring optical telecommunications signals.
Figure 3:
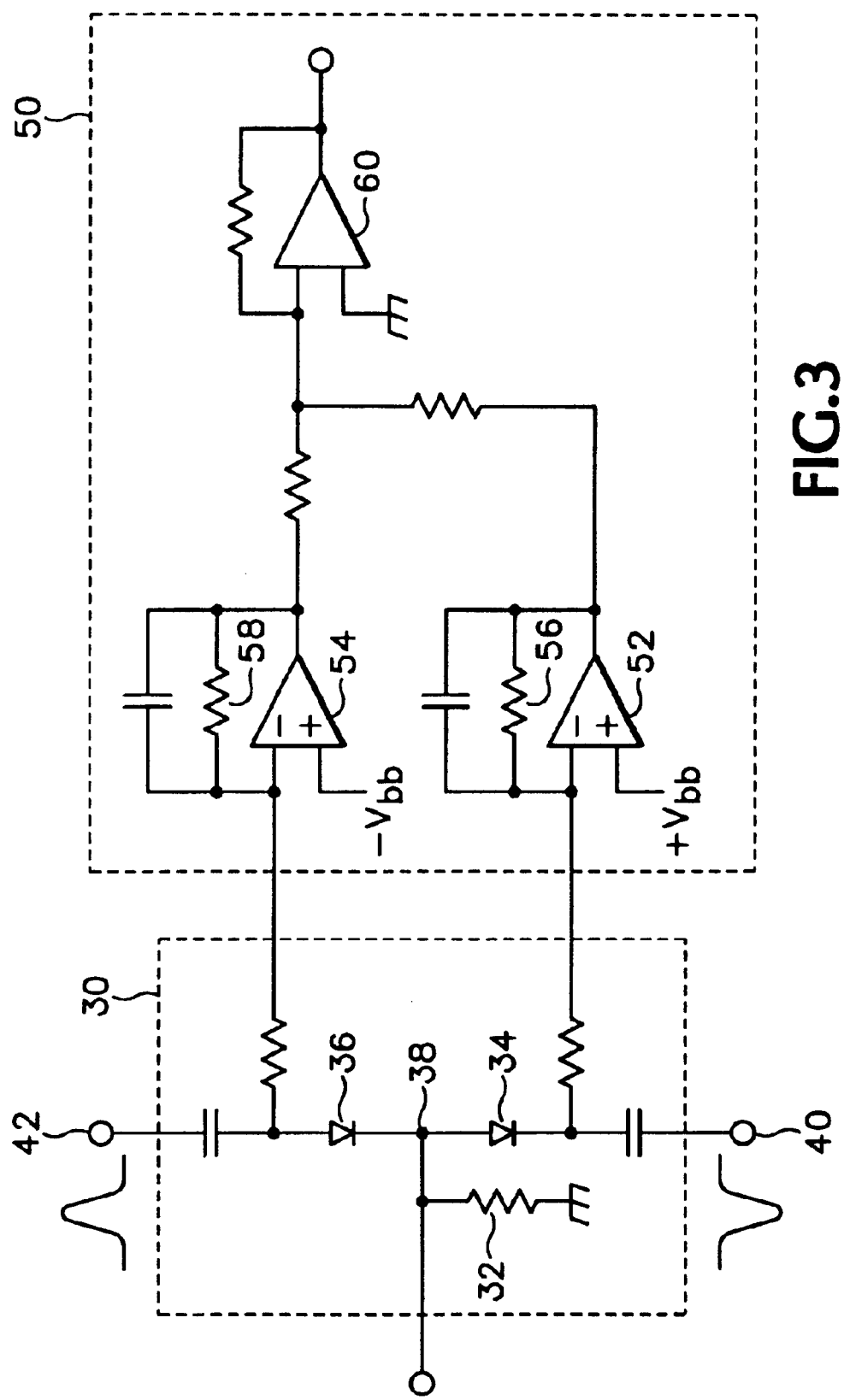
FIG. 3 is a typical output amplifier circuit associated with a sampling circuit usable in a prior art reference receiver.
Figure 4:
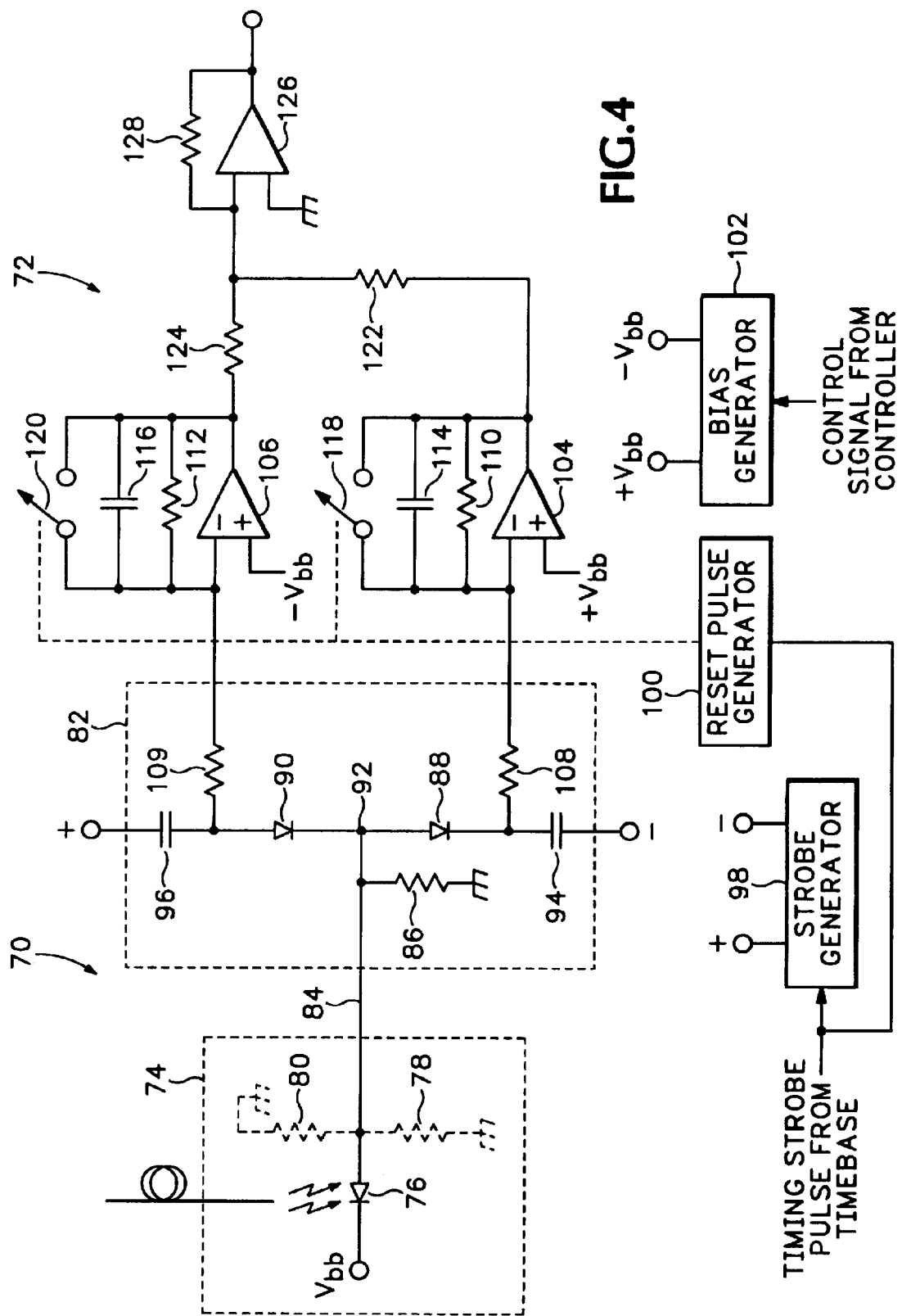
FIG. 4 is a schematic representation of the reference receiver and associated output amplifier according to the present invention.

Referring to FIG. 4, there is shown a schematic representation of the reference receiver 70 and associated output amplifier 72 according to the present invention. The reference receiver 70 has an optical-to-electrical (O/E) converter 74 that receives an optical signal under test. In the preferred embodiment of the invention, the optical signal has a data rate in the range of 10 Gbps. Such data rated may include 9.952 Gbps, 10.667 Gbps, 12.5 Gbps and the like. The present invention is also applicable for higher data rates, such as 40 Gbps. The O/E converter 74 has a PIN photodiode 76 that converts the optical signal into an electrical current signal. Optional resistors 78, 80 may be added to the O/E converter 74 to provide a DC path for leakage or provide reverse termination where optical signal sensitivity is not an issue. When used as a DC path for leakage, these resistors would have substantially higher resistive values, such as 2000 ohms, than a typical reverse termination resistor for a 50 ohm transmission line. The electrical signal output from the O/E converter 74 is coupled to a sampling circuit 82 via a transmission line 84. In the preferred embodiment, the transmission line has a 50 ohm characteristic impedance. The sampling circuit 82 has a termination resistor 86 that terminates the transmission line 84 in its characteristic impedance, which creates a voltage drop in response to the electrical current signal. The sampling circuit 82 has serially connected sampling diodes 88, 90 that have a common node 92 coupled to the transmission line 84. The opposing sides of each of the diodes are capacitively coupled via capacitors 94, 96 to receive strobe gating signals from a strobe generator 98. The strobe generator may be driven by a timing strobe pulse from a time base associated with a sampling oscilloscope. The strobe gating signals are opposing positive and negative going signals that gate the sampling diodes 88, 90 into conduction during selected time intervals. The timing strobe pulse is also applied to a reset pulse generator 100 that generates a reset pulse for the output amplifier 72. A bias generator 102 produces $+V_{bb}$ and $-V_{bb}$ bias output voltages that are applied to the non-inverting input terminals of operational amplifiers 104 and 106. Control signals from a controller or the like may be applied to the bias generator for varying the bias output voltages to the operational amplifiers 104 and 106. The inverting input terminals of the operational amplifiers 104, 106 are set to the respective bias voltage levels of the non-inverting input terminals by feedback through resistors 110, 112. The $+V_{bb}$ and $-V_{bb}$ bias voltages at the inverting input terminals of the amplifiers 104 and 106 are respectively coupled through resistors 108 and 109 to the cathode of sampling diode 88 and the anode of sampling diode 90. The respective sampled electrical signal outputs from sampling diodes 88 and 90 are coupled to the inverting input terminals of operational amplifiers 104 and 106. The operational amplifiers 104 and 106 each have high ohmic value feedback resistors 110 and 112 in parallel with capacitors 114 and 116 and switches 118 and 120. The electrical signal outputs of the operational amplifiers 104 and 106 are coupled through resistors 122 and 124 and summed at the inverting input node of summing amplifier 126. Summing amplifier 126 is a transimpedance amplifier having a feedback resistor 128. The summed electrical signal from the summing amplifier 126 is digitized and further processed for display on a display device.

Figure 5:
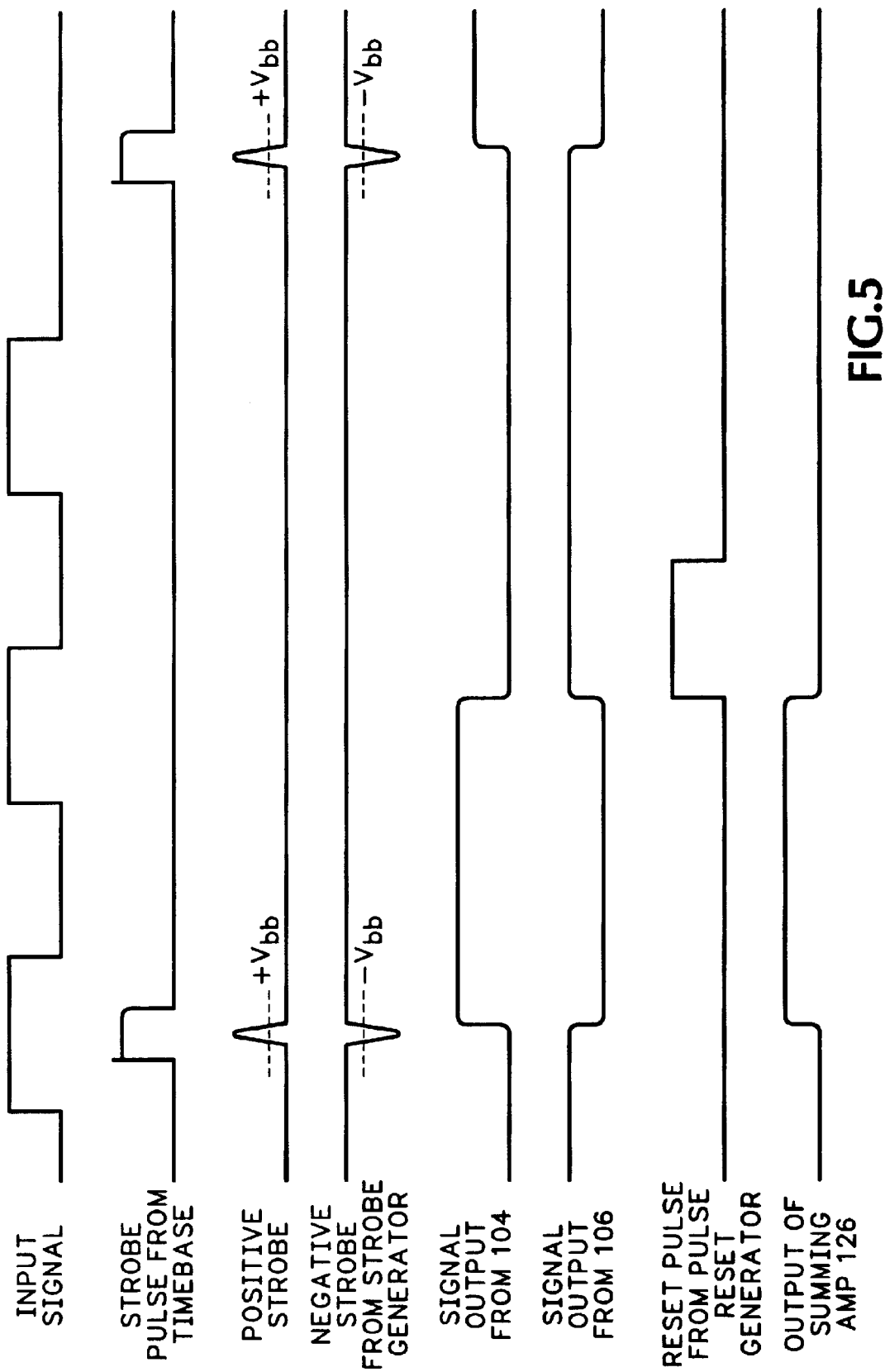
FIG. 5 is a signal timing diagram for use in explaining the operation of the reference receiver and associated output amplifier according to the present invention.

Referring to FIG. 5, there is shown a signal timing diagram for use in explaining the operation of the reference receiver 70 and associated output amplifier 72 according to the present invention. The optical input signal under test is coupled to the photodiode 76 in the O/E converter 74 which converts the optical signal to an electrical signal. The electrical signal is coupled via the transmission line 84 to the common node 92 input of the sampling circuit 82. The sampling diodes 88 and 90 are biased by the $+V_{bb}$ and $-V_{bb}$ bias voltages from the operational amplifiers 104 and 106. An common mode offset voltage may be applied to the sampling diodes 88 and 90 via the bias generator 102 that shifts the bias voltages levels in common mode. Positive and negative going strobe pulses are generated by the strobe generator 98 in response to a received timing strobe pulse.

In the preferred embodiment, the strobe pulse rate is 200 Ksamples/sec but higher or lower strobe rates may be used without departing from the scope of the invention. The positive and negative strobe pulses are applied to the sampling diodes 88 and 90 which drive the diodes into conduction when the strobe voltages exceed the respective bias voltages. In the preferred embodiment of the invention, the strobe has a constant rounded triangular shape that is somewhat Gaussian in nature. The gating time of the sampling diodes 88 and 90 vary as a function of the bias levels on the diodes because of the triangular shape of the gating pulses. A reduced bias level results in a lower bandwidth gating and a higher bias level results in a higher bandwidth gating. The bias voltages in combination with the strobe pulses are adjusted to produce a frequency rolloff response that approximates a Bessel-Thompson filter frequency response. The filter created by an ideal sampler is a rectangular gate function in the time domain which has a sin(f)/f characteristic in the frequency domain. While a real sampler will not follow the ideal response Bessel-Thompson filter response, it may be used in a reference receiver as the dominant filter and therefore is an important component of the reference receiver system. The width of the gate function, or sampling aperture, depends on the width of the strobe applied to the sampling gate and can be adjusted electronically. The width of the gate function is set by the $+V_{bb}$ and $-V_{bb}$ bias voltages on the sampling diodes 88 and 90. Varying the bias voltages on the sampling diodes 88 and 90 changes the voltage levels at which the strobe signals turn on the sampling diodes. For a gate width of τ, the first order approximation of the impulse response of the sampler is a rectangular impulse of width τ and a step response is a ramp of duration τ. In the frequency domain the response is:

$$H(f)=\sin(\pi f\tau)/\pi f\tau \tag{1}$$

The −3 dB frequency is $f_{3db}=0.443/\tau$. Even though the sampler filter deviates somewhat from the Bessel-Thompson filter frequency response, it shares properties of the that make it useful in the reference receiver. The step response of the sampler filter has no overshoot and settles quickly. This reduces aberration in the sampled data that appears as ringing in the displayed signal. Because of the zero in the response at $f=1/\tau$ (1.7 times the bit rate), the sampler filter is a strong filter in the frequency band of interest, allowing it to come close to the forth order response specified in the standards. Where the response does come back up at $f=2/\tau$, or 3.4 times the bit rate, other band limiting factors, such as the O/E converter 74 bandwidth, help further attenuate the signal.

Reducing the bandwidth of the sampling circuit 82 to produce the predominant frequency rolloff or response of the reference receiver 70 has the advantage of eliminating the previously used hardware filter and switching relays of the prior art. Variations in discrete filter characteristics are no longer a concern allowing for greater variations in O/E and interconnect components since the strobe bandwidth to the sampling circuit 74 can be continuously tuned to optimize the system bandwidth to the nominal target response window. Further, multiple reference receiver data rates within the capable strobe bandwidth adjustment range can be achieved without the use of discrete filter and switching relays. The sampling bandwidth can be adjusted to accommodate bit rates of 9.952 Gbps, 10.667 Gbps, 12.5 Gbps and the like. Removing the discrete filter also eliminates reflections and allows removal of the photodiode reverse termination. Removing the reverse termination increases the overall optical to electrical conversion gain due to the larger resistive loading seen by the photodiode current thus improving sensitivity. Further, removing the reverse termination optimizes the temporal response of the photodiode when using the receiver for non-filter applications when all-out bandwidth is desired.

The opposing strobe pulses drive the sampling diodes 88, 90 into conduction and couple the respective electrical signals to the inverting inputs of the operational amplifiers 104, 106. A zero volt input to the sampling circuit 82 with no common mode offset voltage applied causes the relative bias level of each diode 88, 90 to be equal resulting in the operational amplifiers 104, 106 generating integrated voltage levels that cancel each other. Any non-zero voltage input unbalances the instantaneous total bias between the diodes resulting in a measurable difference in the integrated voltages of the operational amplifiers 104, 106. The positive going strobe pulse causes current to flow from the operational amplifier 106 into the sampling diode 90 which produces a positive going output signal from the operational amplifier. The negative going strobe pulse causes current to flow from the sampling diode 88 into the operational amplifier 104 which produces a negative going output signal from the operational amplifier 104. The feedback resistors in the operational amplifiers 104 and 106 have a preferred ohmic value in the range of 100 Megohms to reduce amplifier noise as previously stated and to allow for conventional slow sample rates. The respective resistive-capacitive networks consisting of resistor 110 and capacitor 114 and resistor 112 and capacitor 116 have very long time constants. The resistors 110 and 112 are needed at slow sample rates to prevent the leakage charge into the capacitors 114 and 116 from integrating to a level that drives the outputs of the operational amplifiers 104 and 106 to the voltage rails of the amplifiers. Limiting the sample rate of the sampling circuit to the high sample rates envisioned for the invention would not require the inclusion of the feedback resistors 110 and 112 in the operation amplifiers 104 and 106. Because of the substantially long time constants and the short strobe period associated with a 200 Ksample/sec sampling rate, the resistive-capacitive networks do not have sufficient time to discharge the stored charge on the capacitors 114 and 116 resulting from the DC currents caused by the integrated strobe pulses. To remove the stored charges on the capacitors 114 and 116, electronic switches 118, 120 are respectively coupled in parallel with the feedback RC networks of the operational amplifiers 104 and 106. The electronic switches 118 and 120 receive a reset pulse from a reset pulse generator that is timed with the strobe pulses applied to the sampling circuit 82. At a predetermined time interval from the strobe pulses, which in the preferred embodiment is approximately 500 ns, the reset pulse is applied to the electronic switches 118 and 120 which closes the circuit and discharges the stored charges on the capacitors 114 and 116. The reset time delay for the reset pulse may be less for higher strobe rates. The electronic switches 118 and 120 remain closed for a period in the range of 500 ns but may be less so long as the stored charges on the capacitors are discharged and the amplifiers are stabilized. The electronic switches 118 and 120 open-up with the removal of the reset pulse and the operational amplifiers 104 and 106 are in condition to receive the electrical signal during the next sampling period.

The negative and positive going output signals from the operational amplifiers 104 and 106 are respectively coupled through resistors 122 and 124 to the inverting input terminal of transimpedance summing amplifier 126. Summing the opposing output signals removes the integrated charge pulse. DC currents of the amplifiers resulting in a summed output voltage representative of the accumulated electrical input signal to the sampling circuit over the sampling aperture. The output signals from the operational amplifiers 104 and 106 may also be capacitively coupled to the summing amplifier. The summing amplifier circuit would be modified by adding a capacitor in parallel with the amplifier feedback resistor and capacitively coupling the summing amplifier output signal across a load resistor. A switch could also be added across the feedback capacitor to reset this stage, if needed. The summed output signals are amplified and coupled to additional circuitry for digitization, processing and display.

FIG. 6 shows a representative time domain reference receiver sampling system 130 incorporating a sampling oscilloscope 132 with the reference receiver 134 and associated output amplifier 136 of the present invention. An optical signal under test is coupled to the optical-to-electrical (O/E) converter 138 of the reference receiver 134. The block diagram elements of the reference receiver 134 in this figure represent the circuit design. and description of the reference receiver elements in FIG. 5. The electrical signal output of the O/E converter 138 is coupled via a transmission line 140 to the sampling circuit 142 that receives positive and negative going strobe pulses from the strobe generator 144. Positive and negative bias voltages $+V_{bb}$ and $-V_{bb}$ are applied from the bias generator 150 to the non-inverting input terminals of the operational amplifiers 146, 148 in the output amplifier 136. The bias voltages $+V_{bb}$ and $-V_{bb}$ set the quiescent the voltage levels on the inverting input terminals of the operational amplifiers 146, 148 which bias the sampling diodes in the sampling circuit 142. The sampled electrical signal from the sampling circuit 142 is coupled to the inverting input terminals of the operational amplifiers 146, 148. Connected in parallel between the respective inverting input terminals and the output terminals of the operational amplifiers 146, 148 are feedback resistors 152, 154, charging capacitors 156, 158, and electronic switches 160, 162. The electronic switches 160, 162 are connected to the reset pulse generator 164 that selectively closes the switches during the reset period. The output terminals of the operational amplifiers 146, 148 are coupled to the inverting input terminal of the transimpedance amplifier 166. The summed output of the amplifier 166 is coupled through a variable gain amplifier 167 to a track and hold (T/H) circuit 168 that receives sample strobes from the reset pulse generator 164. The held output of the T/H circuit 168 is coupled to amplifier 170 whose output is coupled to an analog-to-digital (A/D) converter 172 that receives a digitizing clock signal from controller 174. The digitized values from the A/D converter 172 are coupled by a data and control bus 176 to the controller 174 for storage in memory 178. Memory 178 includes both RAM, ROM and cache memory with the RAM memory storing volatile data, such as the data values representative of the optical input signal. In the preferred embodiment, the controller 174 is a PENTIUM® microprocessor, manufactured and sold by Intel, Corp., Santa Clara, Calif.

The data and control bus 176 may also be coupled to a display device 180, such a liquid crystal display, cathode ray tube or the like, and a front panel 182 with buttons, rotatable knobs and the like and/or control entry devices, such as a keyboard and/or mouse. A mass storage unit or units 184, such as a hard disk drive, a CD ROM drive, a tape drive, a floppy drive or the like, that reads from and/or writes to appropriate mass storage media, may also be connected to the data and control bus 176. A time base generator 186 and the bias generator 150 are also coupled to the data and control bus 176. The strobe generator 144 and the reset pulse generator 164 are coupled to receive timing strobe signals from the time base generator 186. In the preferred embodiment, the functions of the reference receiver sampling system 130 are controlled and executed in response to processing routines stored in memory 180 and executed by the controller 174. The processing routines and instructions may be stored and accessed from the ROM memory or from the mass storage media of the mass storage unit 184. The reference receiver sampling system 130 in the preferred embodiment of the invention is a PC based system controlled under WINDOWS®98 operating system, manufactured and sold by Microsoft, Corp., Redmond, WA.

The above reference receiver sampling system 130 has been described using a single controller 174, such as a PENTIUM microprocessor. The reference receiver sampling system 130 may equally be implemented using multiple controller and one or more digital signal processors (DSP). In such a configuration, serial data and control buses may be used to couple data and control signals from the DSPs to the main controller. A separate display processor may be used for controlling the formatting and displaying of the processed digital values representative of the optical signal under test.

The sampling oscilloscope 132 is preferably an equivalent time sampling oscilloscope that acquires a waveform record of samples by selectively delaying the strobe pulses from the time base generator 186. The front panel controls 182 are used to set up the sampling oscilloscope 132 and the reference receiver 134 for receiving a particular bit rate optical signal under test. For example, the optical signal under test may have a bit rate of 9.952 Gbps requiring the bias voltages $+V_{bb}$ and $-V_{bb}$ on the sampling diodes to be set at a level to produce a frequency rolloff response from the sampling circuit 142 that approximates the Bessel-Thompson frequency response for the 9.952 Gbps data standard. The controller 174 operating under program control generates control signals, such as digital control values, that are coupled to the bias generator 150. The control signal adjusts the bias output voltages $+V_{bb}$ and $-V_{bb}$ to produce a sampling aperture in the sampling circuit 142 that approximates the Bessel-Thompson frequency response rolloff for the received data rate. The controller also generates control signals to the time base to initiate the generation of timing strobe pulses that are applied to the strobe generator 144 and the reset pulse generator 164. The strobe generator 144 generates positive and negative strobe pulses in response to the timing strobe pulse that are applied to the sampling circuit 142. The strobe pulses forward bias the sampling diodes in the sampling circuit 142 into conduction when the voltage levels of the strobe pulses exceed the bias voltages $+V_{bb}$ and $-V_{bb}$ on the sampling diodes. The conducting sampling diodes pass the electrical signal from the O/E converter 138 that is representative of the optical input signal under test. The resulting dual electrical signals are coupled to the respective inverting input terminals of the operational amplifiers 146, 148. The operational amplifiers 146 and 148 respectively produce negative and positive going output signals containing the electrical test signal combined with the respective DC voltages resulting from the integrated strobe pulses. The positive and negative going output signals from the operational amplifiers 146, 148 are summed at the inverting input terminal of the summing amplifier 166. The integrated voltage output resulting from the strobe pulse DC currents cancel out resulting in a summed output voltage representative of the electrical input signal to the sampling circuit over the sampling aperture.

The reset pulse generator 164 generates a reset pulse in response to the timing strobe pulse from the time base generator 186 which is applied to the electronic switches 160, 162. The reset pulse generator 164 has time delay circuit that delays the generation of the reset pulses for a predetermined amount of time. In the preferred embodiment, the delay is approximately 500 ns from the generation of the positive and negative going strobe. The electronic switches 160, 162 are closed in response to the reset pulse causing the accumulated charge stored on the respective capacitors 156 and 158 to discharge. In the preferred embodiment, the reset pulse has a width of approximately 500 ns.

During the time period between the application of the positive and negative strobe pulses to the sampling circuit 142 and the application of the reset pulse to the electronic switches 160 and 162, the reset pulse generator 164 further generates a hold strobe pulse to the T/H circuit 168. The output signal from the summing amplifier 166 is conditioned by variable amplifier 167 to an appropriate input level for the T/H circuit 168. The T/H circuit 168 stores a charge representative of the summed electrical signal at the output of the summing amplifier 166. The acquired sample is amplified by amplifier 170 and coupled to the A/D converter 172. The A/D converter 172 converts the electrical sample from the T/H circuit 168 to digital values in response to a digitizing clock signal from the controller 174. The digitized values are stored in memory 178 and processed to produce an output display on display device 180.

The filter response of the reference receiver may be modified by changing the bias voltage levels $+V_{bb}$ and $-V_{bb}$ on the sampling diodes in the sampling circuit 142. The display 180 may be provided with a menu selection allowing for the removal of the Bessel-Thompson frequency rolloff response in the sampling circuit 142. The add/remove filter menu selection is interpreted by the controller 174 which generates a control signal to the bias generator 150 to increase the bias output voltages $+V_{bb}$ and $-V_{bb}$. Increasing the bias output voltages $+V_{bb}$ and $-V_{bb}$ decreases the sampling aperture of the sampling circuit which increases the low pass frequency response of the reference receiver 134. The ability to electronically insert and remove the reference receiver 134 filter using the sampling circuit 142 of the receiver allows for measuring and displaying both the filtered and unfiltered characteristics of the optical signal under test using the same transmission line 140 from the O/E converter 138 to the sampling circuit 142. This is in contrast to the prior art reference receivers that require separate transmission lines and relay switches to couple the filtered and unfiltered electrical signals to the sampling circuit. The relays add additional loss and finite reflections which degrade bandwidth and aberration performance.

A reference receiver and associated output amplifier has been described for a reference receiver sampling system where the sampling circuit in the reference receiver is tuned to produce an approximate Bessel-Thompson frequency rolloff response curve that corresponds to various bit rate standards of the telecommunications industry. The reference receiver had an optical-to-electrical converter that converts the optical signal into an electrical signal and couples the signal to the sampling circuit via a transmission line. The reverse termination of the transmission line at the O/E converter is unnecessary due to the sampling circuit being configured as a sampling filter thus eliminating the need for discrete reference receiver filters which cause reflections. Variable bias voltage levels are applied to the sampling circuit as well as positive and negative going strobe pulses. The bias voltage levels in combination with the strobe pulses establishes a sampling aperture the produces the approximate Bessel-Thompson frequency rolloff response. The sampling circuit generates positive and negative going output signals that are respectively applied to the inverting input terminals of two operational amplifiers. Each operational amplifier has a RC network coupled between its inverting input terminal and its output terminal. Respective electronic switches are coupled in parallel with the RC circuits and are selectively closed to remove the stored charge on the RC circuit capacitors between successive strobe pulses. The output voltages are coupled to the inverting input terminal of a summing amplifier that removes the integrated voltage outputs resulting from the strobe pulse DC currents on the operational amplifiers resulting in a summed output voltage representative of the accumulated electrical input signal to the sampling circuit over the sampling aperture. The reference receiver and the associated output amplifier may be incorporated into a sampling oscilloscope to produce a reference receiver sampling system. The sampling aperture of the reference receiver may be modified by changing the bias voltage levels in the sampling circuit to increase or decrease the bandwidth response of the system. These responses can then be varied from a reference receiver approximating a Bessel-Thompson frequency rolloff response consistent with various telecommunications standards to a higher frequency response consistent with a high bandwidth sampling oscilloscope for maximum bandwidth measurements. This allows the sampling system to acquire both filtered and unfiltered samples of the optical signal under test.

Thus, an output amplifier associated with a sampling circuit has been described. Whereas many alteration and modifications to the present invention will be comprehended by a person skilled in the art after having read the foregoing description, it is to be understood that the particular embodiments shown and described by way of illustration are in no way intended to be considered limiting. References to details of particular embodiments are not intended to limit the scope of the appended claims.

What is claimed is:

1. An output amplifier receiving a sampled input signal from a strobed wideband sampling circuit containing a portion of a sampling strobe pulse that produces a DC current in response to the integrated strobe pulse comprising:

first and second operational amplifiers receiving the sampled input signal from the strobed sampling circuit with each operational amplifier having inverting and non-inverting input terminals and an output terminal;

first and second RC circuits with each RC circuit having a high ohmic value resistor in parallel with a charging capacitor, the first RC circuit being coupled from the inverting input terminal to the output terminal of the first operational amplifier and the second RC circuit being coupled from the inverting input terminal to the output terminal of the second operational amplifier with the respective capacitors storing a charge in response to the strobe pulse;

first and second switches with the first switch coupled in parallel with the first RC circuit and the second switch coupled in parallel with the second RC circuit;

a reset pulse generator producing a time delayed reset pulse that is applied to the first and second switches at a delayed time interval from the sampling strobe pulse for removing the stored charge on the capacitor.

2. The output amplifier as recited in claim 1 further comprising a bias generator producing negative and positive bias voltages that are respectively applied to the first and second operational amplifiers.

3. The output amplifier as recited in claim 1 wherein the high ohmic values resistors comprise 100 megohm resistors.

4. The output amplifier as recited in claim 1 wherein the first and switches further comprise electronic switches.

5. The output amplifier as recited in claim 1 wherein the delayed time interval of the rest pulse is in the range of 500 nanoseconds.

6. The output amplifier as recited in claim 1 wherein the sampling strobe pulse has a strobe pulse rate in the range of 200 Ksamples per second.

7. A sampling oscilloscope having a wideband sampling circuit receiving an input signal and producing a sampled output signal in response to a sampling strobe pulse with the sampled output signal containing a portion of the sampling strobe pulse that produces a DC current in response to the integrated strobe pulse with the sampling circuit coupled to an output amplifier comprising:

first and second operational amplifiers receiving the sampled output signal from the strobed sampling circuit with each operational amplifier having inverting and non-inverting input terminals and an output terminal;

first and second RC circuits with each RC circuit having a high ohmic value resistor in parallel with a charging capacitor, the first RC circuit being coupled from the inverting input terminal to the output terminal of the first operational amplifier and the second RC circuit being coupled from the inverting input terminal to the output terminal of the second operational amplifier with the respective capacitors storing a charge in response to the strobe pulse;

first and second switches with the first switch coupled in parallel with the first RC circuit and the second switch coupled in parallel with the second RC circuit;

a reset pulse generator producing a time delayed reset pulse that is applied to the first and second switches at a delayed time interval from the sampling strobe pulse for removing the stored charge on the capacitor.

8. The sampling oscilloscope as recited in claim 7 further comprising a bias generator producing negative and positive bias voltages that are respectively applied to the first and second operational amplifiers.

9. The sampling oscilloscope as recited in claim 7 further comprising a strobe generator receiving a timing strobe pulse for generating the sampling strobe.

10. The sampling oscilloscope as recited in claim 9 wherein the rest pulse generator receives the timing strobe pulse for generating the time delayed reset pulse.

11. The sampling oscilloscope as recited in claim 10 further comprising a time base generator that produces the timing strobe pulse.

12. The sampling oscilloscope as recited in claim 7 wherein the high ohmic values resistors comprise 100 megohm resistors.

13. The sampling oscilloscope as recited in claim 7 wherein the first and second switches further comprise electronic switches.

14. The sampling oscilloscope as recited in claim 7 wherein the delayed time interval of the rest pulse is in the range of 500 nanoseconds.

15. The sampling oscilloscope as recited in claim 7 wherein the sampling strobe pulse has a strobe pulse rate in the range of 200 Ksamples per second.

* * * * *